(12) United States Patent
Tatsuta

(10) Patent No.: US 10,197,659 B2
(45) Date of Patent: Feb. 5, 2019

(54) PATTERN QUALITY MANAGEMENT CHART, PATTERN QUALITY MANAGEMENT METHOD, AND PATTERN FORMATION METHOD

(71) Applicant: FUJIFILM Corporation, Tokyo (JP)

(72) Inventor: Takeichi Tatsuta, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 366 days.

(21) Appl. No.: 15/070,444

(22) Filed: Mar. 15, 2016

(65) Prior Publication Data
US 2016/0195599 A1    Jul. 7, 2016

Related U.S. Application Data

(63) Continuation of application No. PCT/JP2014/065917, filed on Jun. 16, 2014.

(30) Foreign Application Priority Data

Sep. 25, 2013  (JP) ................................. 2013-198071

(51) Int. Cl.
  *G01R 35/00*      (2006.01)
  *B41J 11/00*      (2006.01)
  (Continued)

(52) U.S. Cl.
  CPC ............. *G01R 35/007* (2013.01); *B05D 1/26* (2013.01); *B41J 11/0015* (2013.01); *G01R 31/2894* (2013.01); *H05K 3/125* (2013.01)

(58) Field of Classification Search
  None
  See application file for complete search history.

(56) References Cited

U.S. PATENT DOCUMENTS

2012/0045954 A1*  2/2012  Bleecher ............ C09K 3/18
                                                   442/80
2013/0252847 A1*  9/2013  McKenna ........... B01L 3/5088
                                                   506/9

FOREIGN PATENT DOCUMENTS

JP    S64-005095 A    1/1989
JP    2003-282247 A   10/2003
(Continued)

OTHER PUBLICATIONS

Machine Translation of JP 2006-339583 A (Year: 2006).*
(Continued)

*Primary Examiner* — Shamim Ahmed
*Assistant Examiner* — Bradford M Gates
(74) *Attorney, Agent, or Firm* — Studebaker & Brackett PC

(57) ABSTRACT

A pattern quality management chart includes a chart substrate which is made of the same material as a substrate patterned by a first region having a predetermined affinity to a functional liquid for pattern formation and a second region having an affinity lower than the predetermined affinity, and at least one unit region group formed on the surface of the chart substrate. The unit region group includes a plurality of unit regions which are constituted of the first region surrounded therearound by the second region, and each of the unit regions is classified into either a compliant type unit region which has a shape and a size such that, when a predetermined amount of functional liquid is supplied to the unit region under predetermined supply conditions, the functional liquid does not overflow into the surrounding second region and the unit region is completely filled with the functional liquid, or a non-compliant type unit region which has a shape and a size such that part of the functional liquid overflows into the surrounding second region and/or a part of the unit region is not filled with the functional
(Continued)

liquid. A plurality of unit regions include at least one compliant type unit region and at least one non-compliant type unit region.

15 Claims, 6 Drawing Sheets

(51) Int. Cl.
 *B05D 1/26* (2006.01)
 *G01R 31/28* (2006.01)
 *H05K 3/12* (2006.01)

(56) References Cited

FOREIGN PATENT DOCUMENTS

| | | |
|---|---|---|
| JP | 2006-339583 A | 12/2006 |
| JP | 4325868 B2 | 6/2009 |
| JP | 4575725 B2 | 8/2010 |

OTHER PUBLICATIONS

Notification of Transmittal of Translation of the International Preliminary Report on Patentability and Translation of Written Opinion of the International Searching Authority; PCT/JP2014/065917 dated Apr. 7, 2016.
International Search Report of PCT/JP2014/065917 dated Sep. 9, 2014.
Yasunori Takeda et al., Patterning Method for Silver Nanoparticle Electrodes Using Difference of Hydrophilic and Hydrophobic Properties., Apr. 11, 2012, pp. 25-29, The Institute of Electronics, Information and Communication Engineers.
An Office Action issued by the Taiwanese Patent Office dated Jul. 31, 2017, which corresponds to Taiwanese Patent Application No. 103121803 and is related to U.S. Appl. No. 15/070,444; with English language translation.

\* cited by examiner

MAJOR AXIS DIRECTION END PORTION

MINOR AXIS DIRECTION END PORTION

MAJOR AXIS a

MINOR AXIS b

PATTERN QUALITY MANAGEMENT CHART, PATTERN QUALITY MANAGEMENT METHOD, AND PATTERN FORMATION METHOD

CROSS-REFERENCE TO RELATED APPLICATIONS

This application is a Continuation of PCT International Application No. PCT/JP2014/065917 filed on Jun. 16, 2014, which claims priority under 35 U.S.C. § 119(a) to Japanese Patent Application No. 2013-198071 filed on Sep. 25, 2013. The above application is hereby expressly incorporated by reference, in its entirety, into the present application.

BACKGROUND OF THE INVENTION

1. Field of the Invention

The present invention relates to a pattern quality management chart, and in particular, to a chart which manages pattern quality for supplying a functional liquid for pattern formation to the surface of a substrate patterned by two regions having different affinities to the functional liquid to form a pattern.

The present invention relates to a pattern quality management method which manages pattern quality using the pattern quality management chart and a pattern formation method which forms a pattern while managing pattern quality.

2. Description of the Related Art

In the field of so-called printed electronics, in recent years, there has been attempted a shift from a subtractive method of etching an unnecessary portion to form a pattern to an additive method of forming a pattern of a necessary functional material using coating or printing and laminating a pattern as necessary. Various coating means or printing means have been appropriately used according to suitability, and of these, a noncontact printing method represented by an ink jet method has been attracting attention from the standpoint of not requiring to produce a printing original plate in advance, having excellent dynamic alignment suitability to substrate expansion and contraction accompanied by a thermal history during pattern formation, and coping with a large area process with high accuracy.

On the other hand, in a case where the ink jet method is used for general image printing, image quality largely depends on ejection accuracy of ink and drive accuracy of a carriage or sheet feeding. For this reason, an image process, a landing interference suppression control, and the like are performed to suppress image defects visually recognized for practical use, thereby compensating for image quality.

However, only with these methods, it is difficult to secure sufficient accuracy in giving an electrical function to conductive patterns or semiconductor patterns, such as wirings, electrodes, and antennas, in the field of printed electronics. JP1989-5095A (JP-S64-5095A) suggests a method which forms a conductive pattern using conductive ink through ink jet; however, in particular, when pattern microization is promoted, pattern quality may be significantly deteriorated due to landing interference, such as gathering, movement, or deformation of a plurality of liquid droplets or liquid films, due to variations in the landing positions of the liquid droplets and the landing timing, and disconnection, short-circuiting, or the like of the conductive pattern may easily occur.

Accordingly, for example, JP4575725B suggests a method which creates a lyophilic/liquid repellent pattern of a lyophilic region and a liquid repellent pattern, that is, a pattern of regions different in surface energy on a substrate in advance and drops liquid droplets in the lyophilic region using an ink jet method, thereby performing patterning with high pattern quality to easily exhibit functionality, such as conductivity.

In the substrate on which patterning of the lyophilic region and the liquid repellent region is appropriately performed, it is known that, even though a coating method, such as spin coating or die coating, is used instead of the ink jet method, a conductive pattern having a certain level of quality is obtained, and for example, IEICE Technical Report, Electronic Devices, 112 (5), pp 25-29, 2012-04-11 discloses a method which spin-coats functional ink of silver nanoparticles on a lyophilic/liquid repellent pattern to form a conductive pattern.

In the method disclosed in IEICE Technical Report, Electronic Devices, 112 (5), pp 25-29, 2012-04-11, if the relationship of the surface energy of the lyophilic/liquid repellent pattern on the substrate and functional ink, and in particular, the contact angle of ink to each of the lyophilic region and the liquid repellent region is not in a given range, it is not possible to obtain objective pattern quality. Since the relationship of the surface energy changes due to various factors under the conditions of pattern formation, process management is important to improve quality and yield.

As the factors causing change in the relationship of the surface energy, for example, 1) an intra-lot difference and a change with time before and after coating of a material converted between a lyophilic property and a liquid repellent property with irradiation of ultraviolet rays, electron beams, heat rays, or the like for forming a lyophilic/liquid repellent pattern on a substrate, 2) an environment and a change with time after forming a lyophilic/liquid repellent pattern, 3) changes in physical properties (surface tension and the like) accompanied by an intra-lot difference of functional ink and lapse of time, 4) a light source state of ultraviolet rays, electron beams, or the like or a state of a heat source used for conversion between a lyophilic property and a liquid repellent property, 5) the temperatures of a substrate and functional ink, and the like are considered.

As one of the methods of confirming these factors, JP4325868B discloses a method which disposes a liquid repellent region for evaluation and a lyophilic region for evaluation adjacent to each other on an insulating substrate, prior to forming a wiring pattern, drops the same amount of functional ink in the central portion of each of the liquid repellent region for evaluation and the lyophilic region for evaluation using an ink jet method, and measures the liquid droplet diameter from above through image recognition.

SUMMARY OF THE INVENTION

However, in a region where the contact angle is extremely small, a slight change in contact angle causes a significant change in liquid droplet diameter, and in a region where the contact angle is comparatively large, a change in liquid droplet diameter is little with respect to the magnitude of a change in contact angle.

For example, FIG. 16 shows an example where a liquid droplet is considered to be a spherical segment (a sphere, a part of which is cut by one plane) having a given volume and the relationship between a contact angle and a liquid droplet diameter is approximately calculated. The relationships in a case where the liquid droplets are dropped in two kinds of amounts of 10 pL ($10 \times 10^{-15}$ m$^3$) and 1 pL ($1 \times 10^{-15}$ m$^3$) are shown. In all kinds of amounts of liquid droplets, it is understood that, in a case where the contact angle is small, the liquid droplet diameter changes significantly with respect to the contact angle, and if the contact angle becomes larger, even though the contact angle changes, the liquid droplet diameter does not almost change. For example, in a case where the liquid droplets are dropped in the amount of 1 pL, the liquid droplet diameter when the contact angle is 90 degrees is 7.8 µm, the liquid droplet diameter when the contact angle is 95 degrees is 7.5 µm, and even through the contact angle has a difference of 5 degrees, the liquid droplet diameter has only a difference of a sub-micron order.

For this reason, in the method disclosed in JP4325868B, an enlargement optical system, such as a microscope, which is used to measure the liquid droplet diameter requires high resolution, a measurement error is large, and it is difficult to confirm the above-described factors with high accuracy.

The invention has been accomplished in order to solve the problems inherent in the related art, and an object of the invention is to provide a pattern quality management chart capable of easily determining suitability of pattern formation conditions.

Another object of the invention is to provide a pattern quality management method which manages pattern quality using a pattern quality management chart and a pattern formation method which forms a pattern while managing pattern quality.

A pattern quality management chart according to the invention which manages pattern quality for supplying a functional liquid for pattern formation to the surface of a substrate patterned by a first region having a predetermined affinity to the functional liquid and a second region having an affinity lower than the predetermined affinity under predetermined supply conditions to form a pattern includes a chart substrate which is made of the same material as the substrate, and at least one unit region group formed on the surface of the chart substrate. The unit region group includes a plurality of unit regions constituted of the first region surrounded therearound by the second region, each of the unit regions is classified into either a compliant type unit region which has a shape and a size such that, when a predetermined amount of functional liquid is supplied to the unit region under the predetermined supply conditions, the functional liquid does not overflow into the surrounding second region and the unit region is completely filled with the functional liquid or a non-compliant type unit region which has a shape and a size such that part of the functional liquid overflows into the surrounding second region and a part of the unit region is not filled with the functional liquid, and the plurality of unit regions include at least one compliant type unit region and at least one non-compliant type unit region.

Each of the plurality of unit regions may have an elliptical shape or a rectangular shape having a minor axis and a major axis.

In this case, it is preferable that the plurality of unit regions include, as the non-compliant type unit region, at least one unit region which has a length of a minor axis such that, when a predetermined amount of functional liquid is supplied to the unit region under the predetermined supply conditions, part of the functional liquid overflows into an adjacent second region in the minor axis direction and at least one unit region which has a length of a major axis such that, when a predetermined amount of functional liquid is supplied to the unit region under the predetermined supply conditions, a part of the unit region in the major axis direction is not filled with the functional liquid.

Alternatively, the plurality of unit regions may include, as the non-compliant type unit region, at least one unit region which has a length of a minor axis such that, when a predetermined amount of functional liquid is supplied to the unit region under the predetermined supply conditions, part of the functional liquid overflows into an adjacent second region in the minor axis direction, and a length of a major axis such that a part of the unit region in the major axis direction is not filled with the functional liquid.

The plurality of unit regions may include a plurality of compliant type unit regions in which at least one of a minor axis and a major axis is different in length, and a plurality of non-compliant type unit regions in which at least one of a minor axis and a major axis is different in length.

Each of the plurality of unit regions may have a circular shape or a square shape.

It is preferable that the plurality of unit regions included in the unit region group are arranged such that the centers thereof are arranged at regular intervals.

The plurality of unit region groups may be arranged and formed on the surface of the chart substrate.

The plurality of unit regions may be formed through any of laser irradiation, electron beam irradiation, radiant ray irradiation using a photomask, plasma processing using a shadow mask, and nanoimprinting.

A pattern quality management method according to the invention which manages pattern quality for supplying a functional liquid for pattern formation to the surface of a substrate patterned by a first region having a predetermined affinity to the functional liquid and a second region having an affinity lower than the predetermined affinity under predetermined supply conditions to form a pattern includes producing the above-described pattern quality management chart, supplying the predetermined amount of functional liquid to each of the plurality of unit regions of each unit region group of the pattern quality management chart, evaluating a wetting spread shape of the functional liquid in the plurality of unit regions, and determining suitability of pattern formation conditions based on an evaluation result of the wetting spread shape of the functional liquid.

It is preferable that the wetting spread shape of the functional liquid is evaluated according to one of whether or not the corresponding unit region is completely filled with the functional liquid, whether or not part of the functional liquid overflows from the unit region into the surrounding second region, and whether or not a part of the unit region is filled with the functional liquid.

The evaluation of the wetting spread shape of the functional liquid may be performed visually or through image recognition with an enlarged image of each of the unit regions.

It is preferable that the supply of the functional liquid to the plurality of unit regions is performed using an ink jet method.

A pattern formation method according to the invention includes, as a series of processing steps, a patterning step of patterning the surface of a substrate by a first region having a predetermined affinity to a functional liquid for pattern formation and a second region having an affinity lower than the predetermined affinity, and a supply step of supplying the functional liquid to the first region on the surface of the substrate under the predetermined supply conditions to form a pattern. An evaluation result of a wetting spread shape of the functional liquid in the plurality of unit regions using the pattern quality management method is reflected in pattern formation through the series of processing steps.

According to the invention, each of the unit regions included in the unit region group formed on the surface of the chart substrate is classified into either a compliant type unit region which has a shape and a size such that, when a predetermined amount of functional liquid is supplied to the unit region under the predetermined supply conditions, the functional liquid does not overflow into the surrounding second region and the unit region is completely filled with the functional liquid or a non-compliant type unit region which has a shape and a size such that part of the functional liquid overflows into the surrounding second region and a part of the unit region is not filled with the functional liquid, and the plurality of unit regions include at least one compliant type unit region and at least one non-compliant type unit region; therefore, a predetermined amount of functional liquid is supplied to each of a plurality of unit regions to evaluate the wetting spread shape of the functional liquid, whereby it is possible to easily determine the suitability of the pattern formation conditions.

BRIEF DESCRIPTION OF THE DRAWINGS

FIG. 3A is a diagram showing a contact angle in a first region, FIG. 3B is a diagram showing a contact angle in a second region, and FIG. 3C is a diagram showing a contact angle in the boundary between the first region and the second region.

FIG. 4A is a diagram showing a contact angle in an end portion in a major axis direction, and FIG. 4B is a diagram showing a contact angle in an end portion in a minor axis direction.

FIG. 5A is a diagram showing a wetting spread shape in a compliant type unit region, FIG. 5B is a diagram showing a wetting spread shape in a non-compliant type unit region, and FIG. 5C is a diagram showing a wetting spread shape of other non-compliant type unit regions.

FIG. 8A is a diagram showing a wetting spread shape in a compliant type unit region, FIG. 8B is a wetting spread shape in a non-compliant type unit region, and FIG. 8C is a diagram showing a wetting spread shape of other non-compliant type unit regions.

DESCRIPTION OF THE PREFERRED EMBODIMENTS

Hereinafter, an embodiment of the invention will be described based on the accompanying drawings.

Embodiment 1

Figure 1:
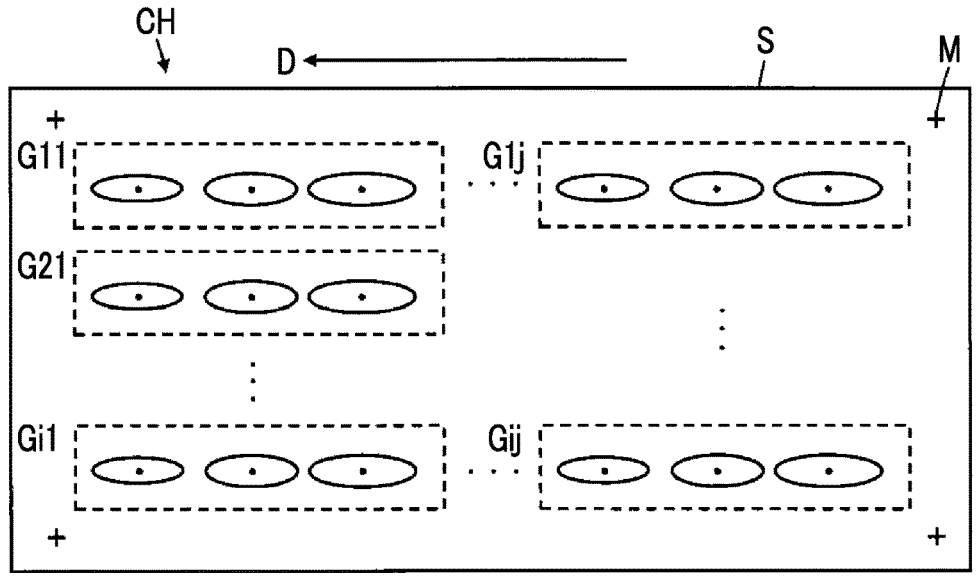
FIG. 1 is a plan view showing a pattern quality management chart according to Embodiment 1 of the invention.

FIG. 1 shows the configuration of a pattern quality management chart CH according to Embodiment 1 of the invention. The pattern quality management chart CH has a flat plate-shaped chart substrate S, and a plurality of unit region groups G11 to Gij are formed on the surface of the chart substrate S.

The chart substrate S is made of the same material as a substrate for actually forming a functional pattern, and has alignment marks M formed at four corners. A plurality of unit region groups G11 to Gij (where i and j are a positive integer) are arranged and formed in i rows and j columns with respect to a predetermined direction D of the chart substrate S. That is, j unit region groups are arranged in the predetermined direction D, and i unit region groups are arranged in a direction perpendicular to the predetermined direction D.

Each of the unit region groups G11 to Gij includes three unit regions R0, R1, and R2 arranged in the predetermined direction D.

Figure 2:
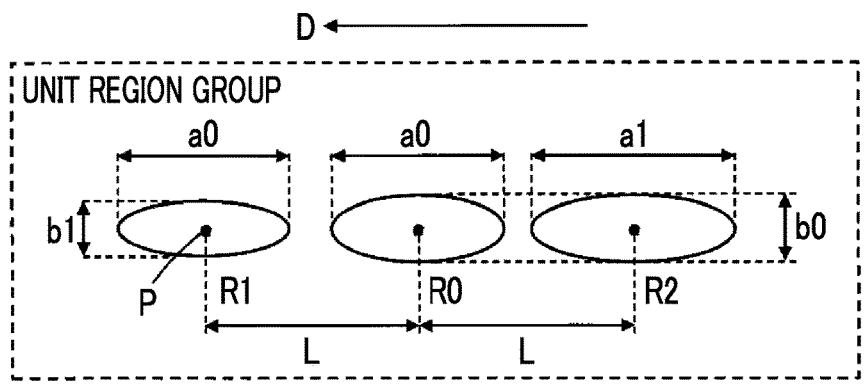
FIG. 2 is a plan view showing one unit region group used in the pattern quality management chart of Embodiment 1.

As shown in FIG. 2, the three unit regions R0, R1, and R2 included in one unit region group are arranged such that a major axis has an elliptical shape directed in the predetermined direction D, and the centers P of adjacent ellipses are arranged at regular intervals. The three unit regions R0, R1, and R2 are different in size, the central unit region R0 has a length a0 of a major axis and a length b0 of a minor axis, the unit region R1 has the same length a0 of a major axis as the unit region R0 and a length b1 of a minor axis shorter than the length b0 of the minor axis of the unit region R0, and the unit region R2 has a length a1 of a major axis longer than the length a0 of the major axis of the unit region R0 and the same length b0 of a minor axis as the unit region R0.

The unit regions R0 included in the unit region groups G11 to Gij have the same shape and size, the unit regions R1 have the same shape and size, and the unit regions R2 have the same shape and size.

The inside of each of the unit regions R0, R1, and R2 is constituted of a first region having a predetermined affinity to a functional liquid for pattern formation, and the outside of each of the unit regions R0, R1, and R2 is constituted of a second region having an affinity lower than the predetermined affinity of the first region. That is, each of the unit regions R0, R1, and R2 is formed of the first region having a comparatively lyophilic property, and the surroundings are surrounded by the second region having a comparatively liquid repellent property.

If patterning of the first region and the second region is performed on a substrate for pattern formation, and a functional liquid for pattern formation is supplied to the first region to form a pattern exhibiting functionality, it is important that the functional liquid sufficiently wets and spreads inside the first region having a predetermined affinity to the functional liquid, and the tip portion of the functional liquid remains on the boundary between the liquid first region and the second region and does not overflow into the second region.

Figure 3A:
FIGS. 3A to 3C show contact angles of liquid drops in various regions.
Figure 3B:
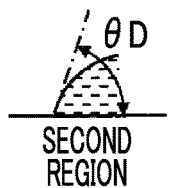

As shown in FIG. 3A, if a contact angle when the functional liquid is dropped on the surface of the first region having the predetermined affinity to the functional liquid for pattern formation and liquid droplets become stable is θw, and similarly, as shown in FIG. 3B, a contact angle when the functional liquid is dropped on the surface of the second region having an affinity lower than the predetermined affinity of the first region and liquid droplets become stable is θD, the relationship of θw<θD is established.

Figure 3C:
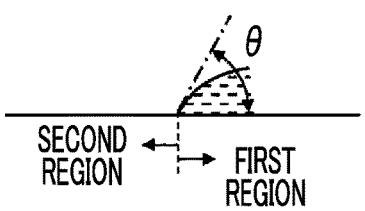

Then, as shown in FIG. 3C, in order to make the functional liquid supplied to the first region spread inside the first region and to make the liquid droplets or the tip of a liquid layer remain on the boundary between the first region and the second region, when the contact angle on the boundary line is θ, the following relationship should be satisfied.

$$\theta w < \theta < \theta D$$

Figure 4A:
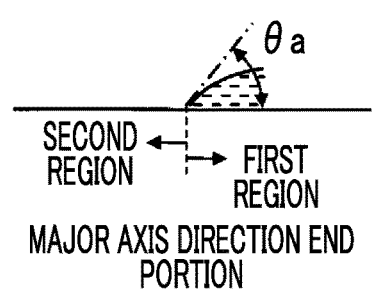
FIGS. 4A and 4B show contact angles in end portions of a compliant type unit region used in Embodiment 1.
Figure 4B:
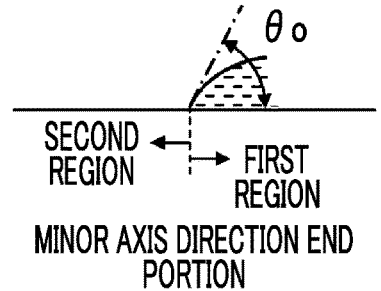

In the pattern quality management chart CH, all of the unit regions R0, R1, and R2 formed of the first region have an elliptical shape; thus, when the functional liquid supplied to the unit regions does not overflow outside the unit regions and the unit regions are completely filled with the functional liquid, and if a contact angle on the boundary between the first region and the second region of a section when each unit region is cut in the major axis direction of the ellipse as shown in FIG. 4A is θa and a contact angle on the boundary between the first region and the second region of a section when each unit region is cut in the minor axis direction of the ellipse as shown in FIG. 4B is θb, the following relationship is satisfied.

$$\theta w < \theta a \leq \theta b < \theta D \quad (1)$$

Accordingly, the length a0 of the major axis and the length b0 of the minor axis of the unit region R0 included in each unit region group of the pattern quality management chart CH are set to values such that Expression (1) described above is established when a predetermined amount of functional liquid for use in actual pattern formation is supplied under predetermined supply conditions the same as pattern formation.

The length b1 of the minor axis of the unit region R1 included in each unit region group is set to a value such that, when a predetermined amount of functional liquid is supplied under predetermined supply conditions, the contact angle θb in the minor axis direction on the boundary between the first region and the second region becomes greater than the contact angle θD in the stable state of the liquid droplets dropped on the surface of the second region and Expression (1) described above is not established.

The length a1 of the major axis of the unit region R2 included in each unit region group is set to a value such that, when a predetermined amount of functional liquid is supplied under predetermined supply conditions, the contact angle θa in the major axis direction on the boundary between the first region and the second region becomes smaller than the contact angle θw in the stable state of the liquid droplets dropped on the surface of the first region and Expression (1) described above is not established.

The lengths a0 and a1 of the major axis and the lengths b0 and b1 of the minor axis are set to these values, whereby the unit regions R0, R1, and R2 in each unit region group are designed.

Figure 5A:
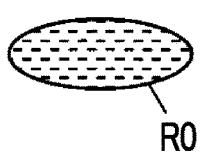
FIGS. 5A to 5C show a wetting spread shape of a liquid in various unit regions used in Embodiment 1.

With this, if a predetermined amount of functional liquid is supplied to each of the unit regions R0, R1, and R2 under predetermined supply conditions the same as pattern formation, in the unit region R0, as shown in FIG. 5A, the functional liquid does not overflow outside the unit region R0 in both of the major axis direction and the minor axis direction, and the unit region R0 is completely filled with the functional liquid.

Figure 5B:
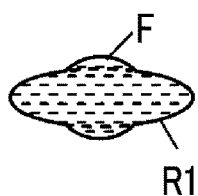

In the unit region R1, as shown in FIG. 5B, the functional liquid does not overflow in the major axis direction having the same length a0 as the unit region R0 and the unit region R1 is filled with the functional liquid, and part of the functional liquid overflows outside the unit region R1 in the minor axis direction having the length b1 shorter than the unit region R0 and an overflow portion F occurs.

Figure 5C:
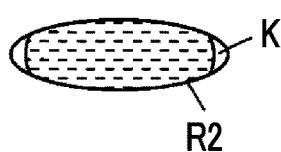

In the unit region R2, as shown in FIG. 5C, the functional liquid does not overflow in the minor axis direction having the same length b0 as the unit region R0 and the unit region R2 is filled with the functional liquid, and a deficient portion K where is not filled with the functional liquid is formed inside the unit region R2 in the major axis direction having the length a1 longer than the unit region R0.

In this way, the unit region R0 which has a shape and a size such that the functional liquid does not overflow to the surroundings and the unit region is completely filled with the functional liquid is referred to as a compliant type unit region, and the unit regions R1 and R2 which have a shape and a size such that part of the functional liquid overflows to the surroundings and a part of the unit region is not filled with the functional liquid are referred to as a non-compliant type unit region.

The pattern quality management chart CH is produced using a lyophilic/liquid repellent conversion apparatus and a substrate of a lot the same as those used for actually forming a functional pattern. The lyophilic/liquid repellent conversion apparatus performs lyophilic/liquid repellent patterning on the surface of the substrate with the first region and the second region, and for example, a laser patterning apparatus using laser irradiation, an electron beam patterning apparatus using electron beam irradiation, an apparatus for irradiating radiant rays, such as ultraviolet rays, using a photomask, a plasma processing apparatus using a shadow mask, a nanoimprinting apparatus, or the like is considered.

The laser patterning apparatus is suitable in that on-demand performance is excellent. As the photomask, a glass mask made of chromium or emulsion is used; however, in this case, not only the photomask for use in forming a functional pattern, but also a photomask for quality management manufactured using a material and a method considered to be the same may be used. The pattern quality management chart CH may be embedded in a part of the photomask for forming a functional pattern for use.

Nanoimprinting is effectively used for forming an ultra-liquid repellent surface using a so-called lotus leaf effect (lotus effect), and regions having different affinities to the functional liquid can be formed according to roughness and fineness. Plasma processing irradiates, for example, a metal mask with plasma, thereby changing the affinity of only a portion exposed to plasma.

In a case where post-treatment is performed with the formation of an actual functional pattern after lyophilic/liquid repellent patterning of the first region and the second region on the pattern quality management chart CH, the same post-treatment, for example, treatment according to a method of using a lyophilic/liquid repellent patterning material, such as heat treatment after lyophilic/liquid repellent patterning is performed, and thereafter, a predetermined amount of functional liquid is supplied to the unit regions R0, R1, and R2 included in each unit region group using the same printing apparatus or coating apparatus as the formation of the actual functional pattern under the same pattern formation conditions. As the printing apparatus, an ink jet apparatus can be used, and as the coating apparatus, spin coating, die coating, or the like can be used.

The same pattern formation conditions include exposure intensity, an exposure amount, the set temperatures of the substrate and ink, the ejection waveform and the ejection amount of ink, the temperature of ink at the time of ejection, and the temperature and atmosphere of the substrate in the case of the ink jet apparatus, a rotation number and a time in the case of spin coating, and a slit die of the same shape, an excursion amount, and a speed in the case of die coating. However, if it can be considered to be substantially equivalent, the conditions may not necessarily be strictly the same.

The contact angle of the functional liquid supplied onto the substrate for actually forming the functional pattern changes depending on various factors described below as described in Description of Related Art.

1) An intra-lot difference and a change with time before and after coating of a material converted between a lyophilic property and a liquid repellent property with irradiation of ultraviolet rays, electron beams, heat rays, or the like for performing lyophilic/liquid repellent patterning on the substrate, 2) an environment and a change with time after lyophilic/liquid repellent patterning, 3) changes in physical properties (surface tension and the like) accompanied by an intra-lot difference of the functional liquid and lapse of time, 4) a light source state of ultraviolet rays, electron beams, or the like or a state of a heat source used for conversion between a lyophilic property and a liquid repellent property, 5) the temperatures of the substrate and the functional liquid, and the like.

If the contact angle of the functional liquid changes depending on these factors and Expression (1) described above is not established, a situation in which the functional liquid supplied to the first region overflows into the surrounding second region or a part of the first region is not filled with the functional liquid occurs, and now, it is difficult to form the functional pattern on the substrate with excellent accuracy according to the lyophilic/liquid repellent patterning of the first region and the second region.

Accordingly, the pattern quality management chart CH is produced under the same conditions as the conditions for actually forming the functional pattern, a predetermined amount of functional liquid is supplied in an equal amount to the unit regions R0, R1, and R2 included in each unit region group of the pattern quality management chart CH, and the wetting spread shape of the functional liquid in each unit region is evaluated, whereby it is possible to determine whether or not the current pattern formation conditions are suitable.

That is, as designed, if in the compliant type unit region R0, the functional liquid does not overflow to the surroundings and the unit region is completely filled with the functional liquid, in the non-compliant type unit region R1, an overflow portion F where a part of the functional liquid overflows in the minor axis direction occurs, and in the non-compliant type unit region R2, a deficient portion K which is not filled with the functional liquid in the major axis direction is formed, the change in the contact angle of the functional liquid depending on various factors is within an allowable range, and it is possible to determine whether or not the current pattern formation conditions are suitable.

In contrast, in a case where in the compliant type unit region R0, the overflow portion F or the deficient portion K occurs, and in the non-compliant type unit regions R1 and R2, the overflow portion F and the deficient portion K do not occur, the contact angle of the functional liquid changes until Expression (1) described above is not established, and it can be determined that it is not possible to form a desired pattern under the current pattern formation conditions. In this case, the reevaluation of the pattern formation conditions and the repetitive evaluation of the wetting spread shape of the functional liquid using the pattern quality management chart CH until it is determined that the pattern formation conditions are suitable are considered.

Figure 6:
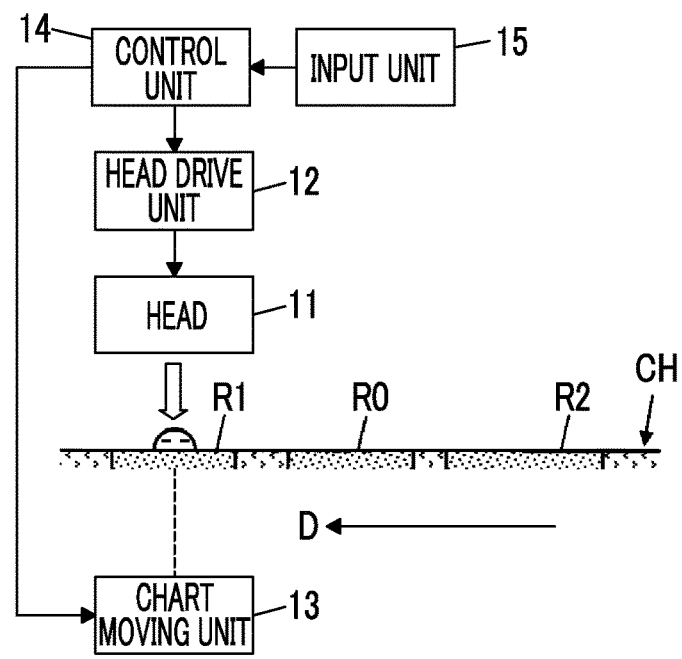
FIG. 6 is a block diagram showing an apparatus for carrying out a pattern quality management method using the pattern quality management chart of Embodiment 1.

FIG. 6 shows an apparatus for carrying out a pattern quality management method using the pattern quality management chart CH of Embodiment 1. This apparatus supplies the functional liquid to each unit region using an ink jet method, a head 11 which ejects the functional liquid is disposed to face the pattern quality management chart CH, and a head drive unit 12 is connected to the head 11. A chart moving unit 13 which moves the pattern quality management chart CH in a predetermined direction D is provided, and a control unit 14 is connected to the head drive unit 12 and the chart moving unit 13. In addition, an input unit 15 is connected to the control unit 14.

Figure 7:
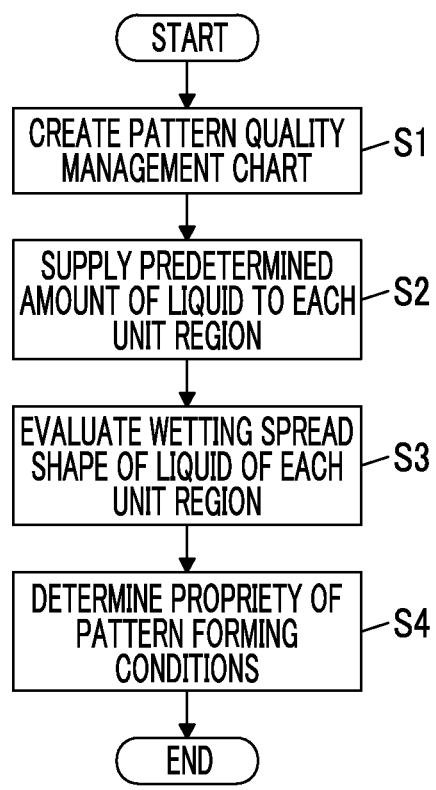
FIG. 7 is a flowchart showing a pattern quality management method using the pattern quality management chart of Embodiment 1.

Next, the pattern quality management method will be described referring to a flowchart of FIG. 7.

First, in Step S1, the pattern quality management chart CH shown in FIG. 1 is produced, and in Step S2, an equal amount of functional liquid set to a predetermined amount is supplied to the three unit regions R0, R1, and R2 included in each unit region group of the pattern quality management chart CH. At this time, the single supply amount of the functional liquid and the amount of movement of the pattern quality management chart CH are input from the input unit 15 to the control unit 14 in advance, and the control unit 14 performs positioning of the pattern quality management chart CH with respect to the head 11 using the alignment marks M of the pattern quality management chart CH, and controls the head drive unit 12 while moving the pattern quality management chart CH using the chart moving unit 13 to supply a predetermined amount of functional liquid from the head 11 to the center P of each unit region.

As shown in FIG. 2, since the three unit regions R0, R1, and R2 included in one unit region group are arranged such that the centers P of the ellipses are arranged at regular intervals L, the pattern quality management chart CH is simply moved by the interval L using the chart moving unit 13, whereby the functional liquid can be easily supplied to the center P of each unit region while minimizing a variation in droplet ejection through ink jet.

In this way, in Step S2, if a predetermined amount of functional liquid is supplied to all of the unit regions R0, R1, and R2 of each of the unit region groups G11 to Gij of the pattern quality management chart CH, subsequently, in Step S3, the wetting spread shape of the functional liquid in each unit region is evaluated. That is, for each of the unit regions R0, R1, and R2, the evaluation results corresponding to the number i×j of the unit region groups G11 to Gij of the pattern quality management chart CH are obtained.

The wetting spread shape is evaluated according to one of whether or not the corresponding unit region is completely filled with the functional liquid, whether or not part of the functional liquid overflows from the unit region to the surrounding second region, and whether or not a part of the unit region is filled with the functional liquid. At this time, an enlarged image of each of the unit regions is generated using a microscope or the like, and the wetting spread shape can be evaluated visually. Alternatively, the wetting spread shape may be evaluated based on the degree of matching or the like with the ellipse representing the corresponding unit region through image recognition. For example, the unit region can be imaged with contrast such that a liquid film can be distinguished, and the contour thereof can be binarized and determined by comparison with the ellipse representing the unit region. Such an image recognition method, such as pattern matching, is used suitably for a repetitive manufacturing process.

Then, Step S4, the suitability of the pattern formation conditions is determined based on the evaluation results of the wetting spread shape of the functional liquid. At this time, for each of the unit regions R0, R1, and R2, the i×j evaluation results are processed statistically, thereby determining the suitability of the pattern formation conditions with high reliability.

However, the pattern quality management chart CH may not necessarily have a plurality of unit region groups, and if at least one unit region group is formed in the pattern quality management chart CH, the wetting spread shape of the functional liquid in each of the unit regions is evaluated, thereby determining the suitability of the pattern formation conditions.

In addition, the functional pattern can be formed based on the pattern formation conditions determined in the above-described manner. That is, in a pattern formation method including, as a series of processing steps, a patterning step of patterning the surface of the substrate with the first region and the second region, and a supply step of supplying the functional liquid to the first region on the surface of the substrate under predetermined supply conditions to form a pattern, the evaluation results of the wetting spread shape of the functional liquid obtained by the above-described pattern quality management method are reflected to pattern formation using a series of processing steps. With this, it is possible to form the functional pattern with high accuracy without being affected by various factors causing a change in contact angle.

For example, a wetting spread shape when contact angles inside and outside an elliptical region of an arbitrary size are set and an arbitrary amount of liquid droplets are dropped inside the elliptical region can be simulated using a droplet simulator "HyDro 1.00" "H. Matsui, Y. Noda, and T. Hasegawa, "Hybrid Energy-Minimization Simulation of Equilibrium Droplet Shapes on Hydrophilic/Hydrophobic Patterned Surfaces", Langmuir, 2012, 28 (44), pp. 15450-15453 (dx-.doi.org/10.1021/la303717n)" published by National Institute of Advanced Industrial Science and Technology on Jul. 31, 2013. For example, the wetting spread shape when the contact angle θw in the first region is set to 15 degrees, the contact angle θD in the second region is set to 60 degrees, and the surface tension of the liquid is set to 30 mN/m and the liquid droplets of 10 pL ($10 \times 10^{-15}$ m$^3$) are dropped inside the elliptical region is shown in FIGS. 8A to 8C.

Figure 8A:
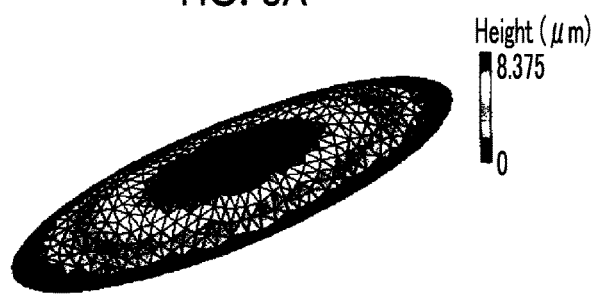
FIGS. 8A to 8C show a wetting spread shape of a liquid calculated through a simulation.
Figure 8B:
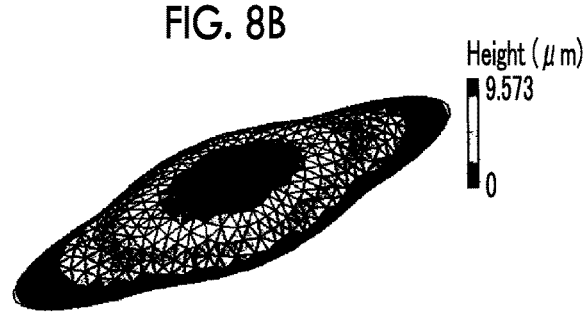
Figure 8C:
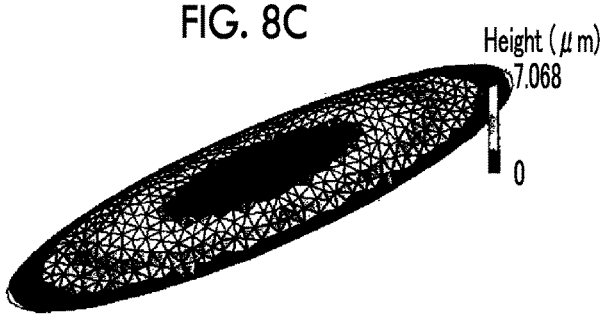

FIG. 8A shows a simulation result in a case where the length of a major axis of the ellipse is set to 100 μm, the length of a minor axis of the ellipse is set to 30 μm, and like the compliant type unit region R0, in both of the major axis direction and the minor axis direction, the liquid does not overflow outside the elliptical region and the elliptical region is completely filled with the liquid. Similarly, FIG. 8B shows a simulation result in a case where the length of the major axis of the ellipse is set to 100 μm, the length of the minor axis of the ellipse is set to 25 μm, and like the non-compliant type unit region R1, part of the liquid overflows outside the elliptical region in the minor axis direction, and FIG. 8C shows a simulation result in a case where the length of the major axis of the ellipse is set to 120 μm, the length of the minor axis of the ellipse is set to 30 μm, and like the non-compliant type unit region R2, a deficient portion which is not filled with the liquid is forming in the end portion of the elliptical region in the major axis direction.

Such a simulation are utilized, whereby the length a0 of the major axis and the length b0 of the minor axis of the compliant type unit region R0, the length a0 of the major axis and the length b1 of the minor axis of the non-compliant type unit region R1, and the length a1 of the major axis and the length b0 of the minor axis of the non-compliant type unit region R2 can be efficiently determined.

In Embodiment 1 described above, since the unit regions R0, R1, and R2 have an elliptical shape with anisotropy in the major axis direction and the minor axis direction, a change in contact angle can be detected more sensitively, and a state where the liquid appropriately wets and spreads inside the unit region or a state where the overflow portion F or the deficient portion K occurs appears as a clear difference with observation of an enlarged image using a microscope or the like. For this reason, it is advantageous in that the evaluation of the wetting spread shape does not easily vary.

Since a plurality of unit region groups are arranged in the predetermined direction D which is the moving direction of the pattern quality management chart CH, in a case where the head 11 has a plurality of nozzles arranged in a direction perpendicular to the predetermined direction D, a plurality of wetting spread shapes from the same nozzle can be evaluated, and the evaluation results are processed statistically, thereby determining the suitability of the pattern formation conditions with high reliability.

In addition, since a plurality of unit region groups are also arranged in the direction perpendicular to the predetermined direction D which is the moving direction of the pattern quality management chart CH, in a case where the head 11 has a plurality of nozzles arranged in the direction perpendicular to the predetermined direction D, a variation in evaluation between the nozzles can be observed. Even in a case where a coating method is utilized instead of an ink jet method, a variation in evaluation due to the difference in the distance in a width direction perpendicular to the predetermined direction D or from the rotation center can be observed.

Various factors causing a change in the contact angle of the functional liquid are involved in one another in complexity, and for example, there may be a case where a factor functioning in a certain positive direction and a factor functioning as a negative direction cancel each other and do not affect the quality of the pattern actually formed. As described above, the determination is performed using the pattern quality management chart CH having high detection sensitivity, whereby it is determined that the pattern formation conditions are suitable in a case where the factors cancel each other not to cause problems actually, and it is possible to start the formation of the pattern and to effectively suppress the loss time.

Information, such as a chart name, test date and time, a machine number, a lot number, and a serial number, may be described in addition to to the pattern quality management chart CH, and a test pattern for a different purpose from pattern quality management may be embedded together.

Embodiment 2

Figure 9:
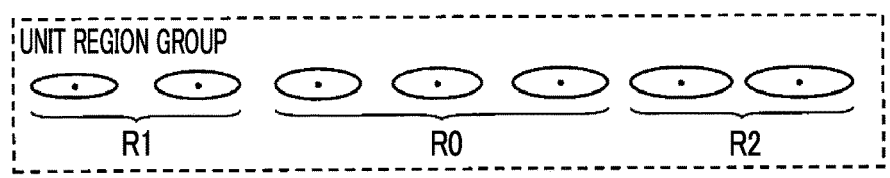
FIG. 9 is a plan view showing one unit region group used in a pattern quality management chart of Embodiment 2.

In Embodiment 1 described above, although each unit region group includes one compliant type unit region R0, one non-compliant type unit region R1, and one non-compliant type unit region R2, the invention is not limited thereto. For example, as shown in FIG. 9, one unit region group may include a plurality of compliant type unit regions R0 where the length of the major axis and the length of the minor axis are changed within a range in which Expression (1) described above is established, a plurality of non-compliant type unit regions R1 where the length of the minor axis is changed within a range in which Expression (1) described above is not established, and a plurality of non-compliant type unit regions R2 where the length of the major axis is changed within a range in which Expression (1) described above is not established.

With the use of this unit region group, it is possible to detect a change in contact angle with higher accuracy, and to determine the suitability of the current pattern formation conditions in more detail.

Figure 10:
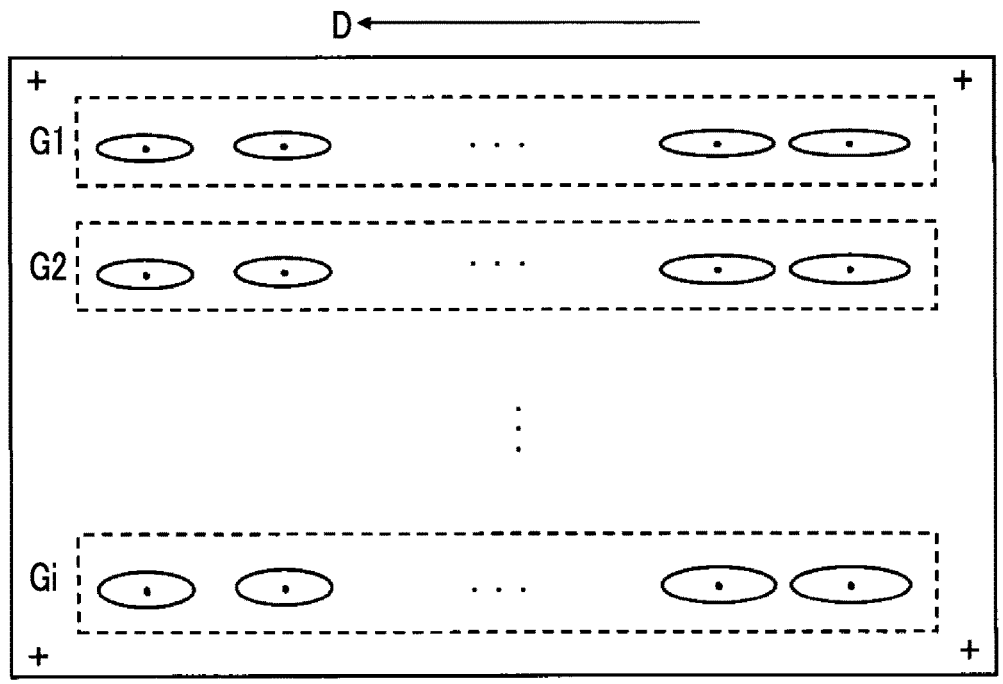
FIG. 10 is a plan view showing a pattern quality management chart according to a modification example of Embodiment 2.

Furthermore, as shown in FIG. 10, a pattern quality management chart in which a plurality of unit region groups G1 to Gi are arranged in a direction perpendicular to the predetermined direction D, each of the unit region groups includes a plurality of unit regions arranged such that the length of the minor axis is the same and the length of the major axis gradually changes in the predetermined direction D, and the length of the minor axis of the unit region gradually changes from the unit region group G1 toward the unit region group Gi may be used. That is, the pattern quality management chart has a plurality of unit regions where the length of the major axis gradually changes in the predetermined direction D and the length of the minor axis gradually changes in a direction perpendicular to the predetermined direction D.

In this way, the unit regions where the lengths of the major axis and the minor axis are changed in several stages or hundred of stages in both of the predetermined direction D and the direction perpendicular to the predetermined direction D. In this case, it is preferable that the centers of a plurality of unit regions are arranged like lattice points at regular intervals in both of the predetermined direction D and the direction perpendicular to the predetermined direction D.

Even with the use of this unit region group, it is possible to detect a change in contact angle with higher accuracy, and to determine the suitability of the current pattern formation conditions in more detail.

Embodiment 3

Figure 11:
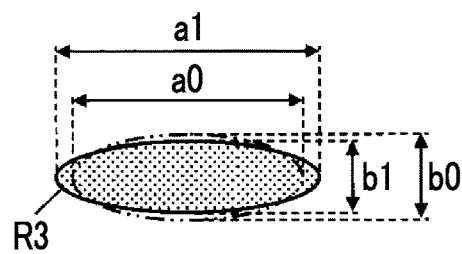
FIG. 11 is a diagram showing a non-compliant type unit region used in a pattern quality management chart of Embodiment 3.

FIG. 11 shows a non-compliant type unit region R3 for use in Embodiment 3. The unit region R3 has the length a1 of the major axis longer than the unit region R0 and the length b1 of the minor axis shorter than the unit region R0 with respect to the length a0 of the major axis and the length b0 of the minor axis of the compliant type unit region R0.

For this reason, when a predetermined amount of functional liquid is supplied to the unit region R3 under predetermined supply conditions the same as pattern formation, part of the functional liquid overflows outside the unit region R3 in the minor axis direction and an overflow portion occurs, and a deficient portion which is not filled with the functional liquid is formed inside the unit region R3 in the major axis direction. That is, the unit region R3 is one unit region, and has the functions of the two non-compliant type unit regions R1 and R2 in Embodiment 1.

Figure 12:
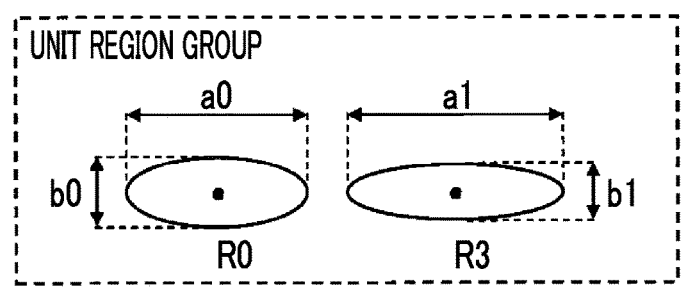
FIG. 12 is a plan view showing one unit region group used in the pattern quality management chart of Embodiment 3.

Accordingly, as shown in FIG. 12, only by forming one compliant type unit region R0 and one non-compliant type unit region R3 in one unit region group, it is possible to perform the evaluation of the wetting spread shape the same as in Embodiment 1.

In Embodiment 3, as in Embodiment 2, a plurality of compliant type unit regions R0 and a plurality of non-compliant type unit regions R3 can be included in one unit region group.

Embodiment 4

Figure 13:
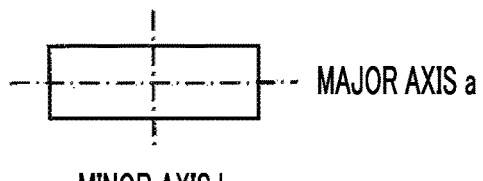
FIG. 13 is a plan view showing a unit region used in a pattern quality management chart of Embodiment 4.

In Embodiments 1 to 3 described above, although all unit regions have an elliptical shape, as shown in FIG. 13, each of the unit regions may have a rectangular shape having a major axis a and a minor axis b.

In this way, like the elliptical shape, it is possible to detect a change in contact angle more sensitively, and a state where the liquid appropriately wets and spreads into the unit region or a state where the overflow portion F or the deficient portion K occurs appears as a clear difference with observation of an enlarged image using a microscope or the like. For this reason, the wetting spread shape hardly varies.

A rectangular shape in which the four corners are rounded may be used.

For forming a unit region through lyophilic/liquid repellent patterning of a first region and a second region on the surface of a substrate using a lyophilic/liquid repellent conversion apparatus, an irradiation pattern of laser, electron beams, radiant rays, or the like is given as digital image data to increase the reproducibility of the unit regions, whereby a preferable rectangular unit region is obtained. It is preferable that a designer appropriately selects either the elliptical shape or the rectangular shape according to the characteristics of the apparatus for use in pattern formation and the system.

However, the elliptical shape is preferably used rather than the rectangular shape in that there is no discontinuous point in the peripheral portion of the unit region.

Embodiment 5

Figure 14:
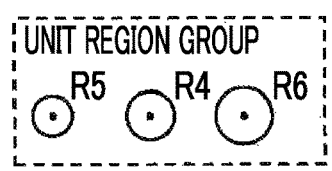
FIG. 14 is a plan view showing one unit region group used in a pattern quality management chart of Embodiment 5.

FIG. 14 shows a unit region group for use in Embodiment 5. The unit region group includes three circular unit regions R4, R5, and R6 instead of the three elliptical unit regions R0, R1, and R2 in the unit region group of Embodiment 1 shown in FIG. 2.

The unit regions R4, R5, and R6 have different radii, and the radius of the unit region R4 is set to a value such that, when a predetermined amount of functional liquid for use in pattern formation is supplied under predetermined supply conditions the same as pattern formation, Expression (1) described above is established.

The radius of the unit region R5 is set to a value such that, when the predetermined amount of functional liquid is supplied under the predetermined supply conditions, Expression (1) described above is not established and part of the functional liquid overflows to the surroundings of the unit region R5.

The radius of the unit region R6 is set to a value such that, when the predetermined amount of functional liquid is supplied under the predetermined supply conditions, Expression (1) is not established and a part of the unit region R6 is not filled with the functional liquid.

That is, the unit region R4 becomes a compliant type unit region, and the unit regions R5 and R6 become a non-compliant type unit region.

Even with the use of the circular unit regions R4, R5, and R6, as in Embodiment 1, it is possible to evaluate the wetting spread shape of the functional liquid in each of the unit regions, and to determine the suitability of the pattern formation conditions.

Figure 15:
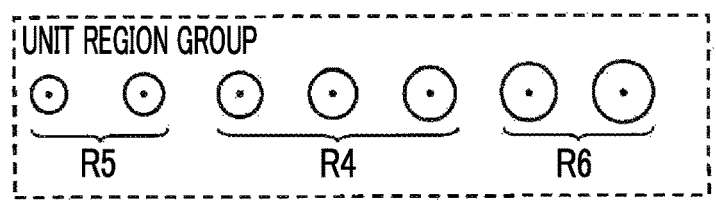
FIG. 15 is a plan view showing one unit region group used in a pattern quality management chart according to a modification example of Embodiment 5.
Figure 16:
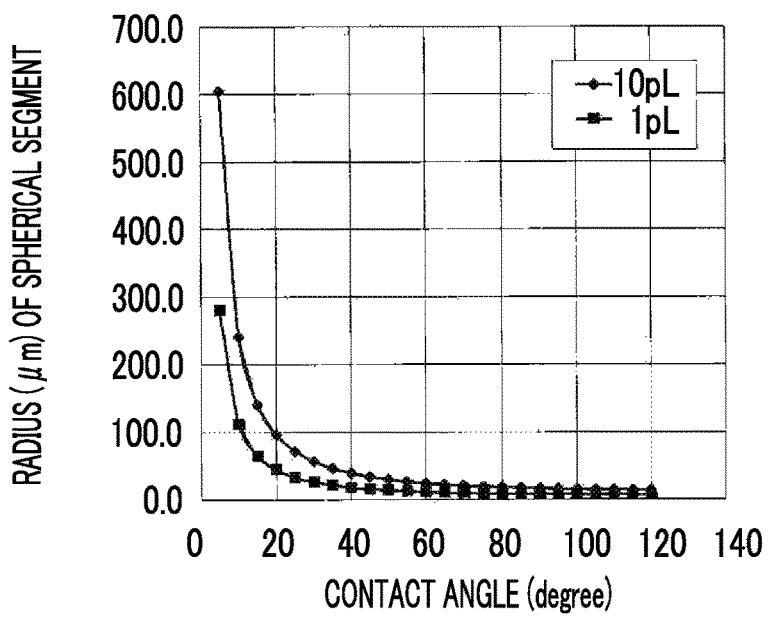
FIG. 16 is a graph showing an example where the relationship between a contact angle and a liquid droplet diameter is approximately calculated.

In Embodiment 5, as in Embodiment 2, as shown in FIG. 15, a plurality of compliant type unit regions R4 where the radius is changed within a range in which Expression (1) described above is established, a plurality of non-compliant type unit regions R5 where the radius is changed within a range in which Expression (1) described above is not established, and a plurality of non-compliant type unit region R6 where the radius is changed within a range in which Expression (1) described is not established can be included in one unit region group.

In this way, it is possible to detect a change in contact angle with higher accuracy, and to determine the suitability of the current pattern formation conditions in more detail.

In Embodiment 5, a square unit region may be used instead of the circular unit region. In this case, as in Embodiment 4 described above, for performing lyophilic/liquid repellent patterning on the surface of a substrate using a lyophilic/liquid repellent conversion apparatus, an irradiation pattern of laser, electron beams, radiant rays, or the like is given as digital image data to increase the reproducibility of the unit regions, whereby a preferable square unit region is obtained. It is preferable that a designer appropriately selects either the circular shape or the square shape according to the characteristics of the apparatus for use in pattern formation and the system.

EXPLANATION OF REFERENCES

11: head, 12: head drive unit, 13: chart moving unit, 14: control unit, 15: input unit, CH: pattern quality management chart, S: chart substrate, G11 to Gij, G1 to Gi: unit region group, M: alignment mark, D: predetermined direction, R0, R4: compliant type unit region, R1, R2, R3, R5, R6: non-compliant type unit region, P: center of ellipse, a0, a1: length of major axis, b0, b1: length of minor axis, L: interval, θw: contact angle in first region, θD: contact angle in second region, θ: contact angle on boundary between first region and second region, θa: contact angle on boundary between first region and second region of section of ellipse in major axis direction, θb: contact angle on boundary between first region and second region of section of ellipse in minor axis direction, F: overflow portion, K: deficient portion.

What is claimed is:

1. A pattern quality management chart for managing pattern quality for supplying a functional liquid for pattern formation to the surface of a substrate patterned by a first region having a predetermined affinity to the functional liquid and a second region having an affinity lower than the predetermined affinity under predetermined supply conditions to form a pattern, the pattern quality management chart comprising:
    a chart substrate which is made of the same material as the substrate; and
    at least one unit region group formed on the surface of the chart substrate,
    wherein the unit region group includes a plurality of unit regions constituted of the first region surrounded therearound by the second region,
    each of the unit regions is classified into either a compliant type unit region which has a shape and a size such that, when a predetermined amount of functional liquid is supplied to the unit region under the predetermined supply conditions, the functional liquid does not overflow into the surrounding second region and the unit region is completely filled with the functional liquid or a non-compliant type unit region which has a shape and a size such that part of the functional liquid overflows into the surrounding second region and a part of the unit region is not filled with the functional liquid, and
    the plurality of unit regions include at least one compliant type unit region and at least one non-compliant type unit region.

2. The pattern quality management chart according to claim 1,
    wherein each of the plurality of unit regions has an elliptical shape or a rectangular shape having a minor axis and a major axis.

3. The pattern quality management chart according to claim 2,
    wherein the plurality of unit regions include, as the non-compliant type unit region, at least one unit region which has a length of a minor axis such that, when a predetermined amount of functional liquid is supplied to the unit region under the predetermined supply conditions, part of the functional liquid overflows into an adjacent second region in the minor axis direction and at least one unit region which has a length of a major axis such that, when a predetermined amount of functional liquid is supplied to the unit region under the predetermined supply conditions, a part of the unit region in the major axis direction is not filled with the functional liquid.

4. The pattern quality management chart according to claim 2,
    wherein the plurality of unit regions include, as the non-compliant type unit region, at least one unit region which has a length of a minor axis such that, when a predetermined amount of functional liquid is supplied to the unit region under the predetermined supply conditions, part of the functional liquid overflows into an adjacent second region in the minor axis direction, and a length of a major axis such that a part of the unit region in the major axis direction is not filled with the functional liquid.

5. The pattern quality management chart according to claim 2,
    wherein the plurality of unit regions include a plurality of compliant type unit regions in which at least one of a minor axis and a major axis is different in length, and a plurality of non-compliant type unit regions in which at least one of a minor axis and a major axis is different in length.

6. The pattern quality management chart according to claim 1,
    wherein each of the plurality of unit regions has a circular shape or a square shape.

7. The pattern quality management chart according to claim 1,
    wherein the plurality of unit regions included in the unit region group are arranged such that the centers thereof are arranged at regular intervals.

8. The pattern quality management chart according to claim 1,
wherein the plurality of unit region groups are arranged and formed on the surface of the chart substrate.

9. The pattern quality management chart according to claim 1,
wherein the plurality of unit regions are formed through any of laser irradiation, electron beam irradiation, radiant ray irradiation using a photomask, plasma processing using a shadow mask, and nanoimprinting.

10. A pattern quality management method which manages pattern quality for supplying a functional liquid for pattern formation to the surface of a substrate patterned by a first region having a predetermined affinity to the functional liquid and a second region having an affinity lower than the predetermined affinity under predetermined supply conditions to form a pattern, the pattern quality management method comprising:
producing the pattern quality management chart according to claim 1;
supplying the predetermined amount of functional liquid to each of the plurality of unit regions of each unit region group of the pattern quality management chart;
evaluating a wetting spread shape of the functional liquid in the plurality of unit regions; and
determining suitability of pattern formation conditions based on an evaluation result of the wetting spread shape of the functional liquid.

11. The pattern quality management method according to claim 10,
wherein the wetting spread shape of the functional liquid is evaluated according to one of whether or not the corresponding unit region is completely filled with the functional liquid, whether or not part of the functional liquid overflows from the unit region into the surrounding second region, and whether or not a part of the unit region is filled with the functional liquid.

12. The pattern quality management method according to claim 10,
wherein the evaluation of the wetting spread shape of the functional liquid is performed visually with an enlarged image of each of the unit regions.

13. The pattern quality management method according to claim 10,
wherein the evaluation of the wetting spread shape of the functional liquid is performed through image recognition with an enlarged image of each of the unit regions.

14. The pattern quality management method according to claim 10,
wherein the supply of the functional liquid to the plurality of unit regions is performed using an ink jet method.

15. A pattern formation method comprising, as a series of processing steps:
a patterning step of patterning the surface of a substrate by a first region having a predetermined affinity to a functional liquid for pattern formation and a second region having an affinity lower than the predetermined affinity; and
a supply step of supplying the functional liquid to the first region on the surface of the substrate under the predetermined supply conditions to form a pattern,
wherein an evaluation result of a wetting spread shape of the functional liquid in the plurality of unit regions using the pattern quality management method according to claim 10 is reflected in pattern formation through the series of processing steps.

* * * * *